United States Patent
Lee

(10) Patent No.: US 7,809,408 B2
(45) Date of Patent: Oct. 5, 2010

(54) METHOD AND SYSTEM FOR A POWER SWITCH WITH A SLOW IN-RUSH CURRENT

(75) Inventor: Chungyeol Paul Lee, San Diego, CA (US)

(73) Assignee: Broadcom Corporation, Irvine, CA (US)

( * ) Notice: Subject to any disclaimer, the term of this patent is extended or adjusted under 35 U.S.C. 154(b) by 636 days.

(21) Appl. No.: 11/617,343

(22) Filed: Dec. 28, 2006

(65) Prior Publication Data

US 2008/0137257 A1    Jun. 12, 2008

Related U.S. Application Data

(60) Provisional application No. 60/868,818, filed on Dec. 6, 2006.

(51) Int. Cl.
*H04M 1/00* (2006.01)
*G05F 1/573* (2006.01)
*H02H 9/08* (2006.01)

(52) U.S. Cl. ............... 455/572; 455/127.1; 455/343.1; 323/908; 323/277; 361/93.9

(58) Field of Classification Search ............. 455/572, 455/343, 127.1; 323/908, 277, 289; 361/93.9
See application file for complete search history.

(56) References Cited

U.S. PATENT DOCUMENTS

| | | | | |
|---|---|---|---|---|
| 4,396,882 A * | 8/1983 | Kellenbenz | ............... | 323/278 |
| 4,494,064 A * | 1/1985 | Harkness | ............... | 323/277 |
| 4,719,553 A * | 1/1988 | Hinckley | ............... | 363/49 |
| 4,731,574 A * | 3/1988 | Melbert | ............... | 323/275 |
| 4,779,013 A * | 10/1988 | Tanaka | ............... | 326/27 |
| 5,375,029 A * | 12/1994 | Fukunaga et al. | ........... | 361/101 |
| 5,969,957 A * | 10/1999 | Divan et al. | ............... | 363/36 |
| 6,163,712 A * | 12/2000 | Winkler et al. | ............ | 455/572 |
| 6,208,185 B1 * | 3/2001 | John et al. | ............... | 327/170 |
| 6,667,652 B2 * | 12/2003 | Hosoki | ............... | 327/538 |
| 6,947,272 B2 * | 9/2005 | Daniels et al. | ........... | 361/93.9 |
| 2002/0196644 A1 * | 12/2002 | Hwang | ............... | 363/89 |
| 2003/0107859 A1 * | 6/2003 | Pan et al. | ............... | 361/58 |

* cited by examiner

*Primary Examiner*—Duc M Nguyen
(74) *Attorney, Agent, or Firm*—McAndrews, Held & Malloy

(57) ABSTRACT

Aspects of a method and system for a power switch with a slow in-rush current are presented. Aspects of the system may include at least one resistive component, which is coupled between an input control signal and an output stage circuit of a power switch circuit, so as to limit a peak transient current level, which may result from in-rush current delivered by the power switch circuit to a load impedance circuit during a transient time interval during which a voltage level across the load impedance circuit may rise or fall from an initial voltage level to a quiescent voltage level.

18 Claims, 8 Drawing Sheets

METHOD AND SYSTEM FOR A POWER SWITCH WITH A SLOW IN-RUSH CURRENT

CROSS-REFERENCE TO RELATED APPLICATIONS/INCORPORATION BY REFERENCE

This application makes reference to, claims priority to, and claims the benefit of U.S. Provisional Application Ser. No. 60/868,818, filed on Dec. 6, 2006.

The above stated application is hereby incorporated herein by reference in its entirety.

FIELD OF THE INVENTION

Certain embodiments of the invention relate to electronic power amplification. More specifically, certain embodiments of the invention relate to a method and system for a power switch with a slow in-rush current.

BACKGROUND OF THE INVENTION

Requirements that increasing levels of functionality be integrated into single substrate integrated circuit (IC) devices may create a pressing need to increase the number of semiconductor devices fabricated into a single substrate. In addition, demands for increasing levels of processing performance may also require that devices operate at faster speeds, as measured in millions of operations per second (MOPS), for example. The two requirements may drive demands that semiconductor fabrication technologies, and design rules enable the design and manufacture of semiconductor devices with increasingly small geometries.

However, as semiconductor device geometries become increasingly smaller, the likelihood of leakage currents in such devices may increase. Leakage currents in semiconductor devices may result in the device continuing to conduct a current under circuit conditions in which the intention was that the device not conduct a current.

One approach to addressing the leakage current limitation may be to insert switching circuitry, which isolates the semiconductor device circuitry from a common voltage source, such as a supply voltage often referred to as $V_{DD}$. The switching circuitry may utilize a control signal, wherein the common voltage source or a buffered version thereof, may be coupled to the semiconductor device circuitry when the switching circuitry receives an ON control signal. Conversely, the common voltage source may be isolated from the semiconductor device circuitry when the switching circuitry receives an OFF control signal.

The utilization of switching circuitry may introduce a new set of limitations, however. For example, when the switching circuitry receives an ON control signal, the switching circuitry, and/or common voltage source, may deliver a common voltage level to semiconductor circuitry, wherein the semiconductor circuitry may be modeled as a load impedance comprising reactive and/or resistive components. Under these circumstances, the switching circuitry and/or common voltage source may be required to supply a large transient, or in-rush, current when driving the semiconductor circuitry from a voltage, such as ground, to the common voltage, $V_{DD}$. Following the transient interval, the current supplied by the switching circuitry may settle to a quiescent current level.

Thus, one limitation when utilizing switching circuitry for common voltage isolation is that the switching circuitry, and/or common voltage source, may require buffers that are able to supply comparatively large transient in-rush current levels when the control voltage causes the switching circuitry to couple the semiconductor circuitry to the common voltage. This may mean, however, that the buffers may be over-designed in relation to the quiescent current level requirements. For example, the peak value for the in-rush current level required of the buffers may be 50 mA, whereas the quiescent current level may be 15 mA.

Power sequencing is another approach, which may be utilized to address the limitations associated with large in-rush current levels. In a power sequencing approach, the switching circuitry may include sequence control circuitry that couples a first portion of the semiconductor circuitry to the common voltage source. When the first portion of the semiconductor circuitry has reached the quiescent current level, the sequence control circuitry may enable the switching circuitry to couple a second portion of the semiconductor circuitry to the common voltage source. The sequencing may continue until a final portion of the semiconductor circuitry is coupled to the common voltage source.

Where power sequencing may reduce the peak value for the in-rush current level, it may require additional circuitry, add complexity to the start up sequence for a circuit, and may also result in longer time intervals for turning on semiconductor circuitry. This, in turn, may negatively impact the processing speed and/or performance of the circuitry. In applications, such as wireless communications, the start up time interval when utilizing a power sequencing approach may be too long.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A method and system for a power switch with a slow in-rush current, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for a power switch with a slow in-rush current. Various embodiments of the invention comprise a method and system by which a power switch circuit may limit current drive into a load impedance and thereby reduce transient in-rush current levels during a start up sequence for a circuit. Enabling the power switch circuit to current limit the amount of current supplied to a load impedance may result in a reduction in the difference in current levels between the transient in-rush current level, and the quiescent current level. This in turn may enable buffer circuitry to be designed to operate more efficiently within the power switch and/or within common supply voltage circuitry by obviating buffer over-design and/or power sequencing approaches.

Figure 1:
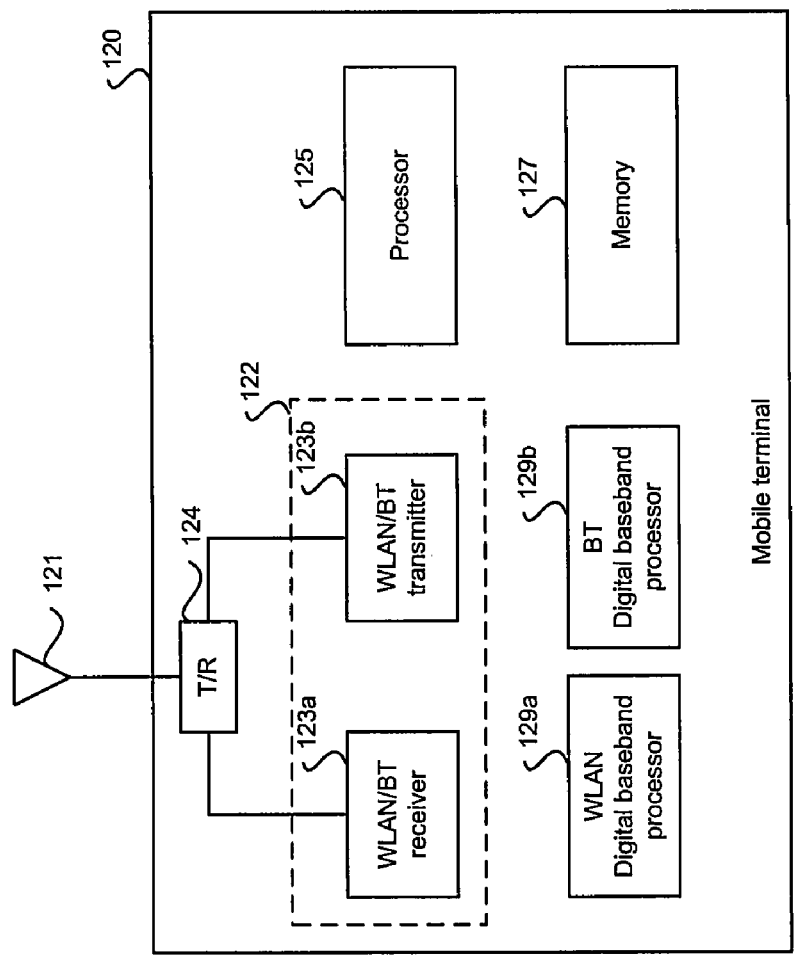
FIG. 1 is a block diagram illustrating an exemplary mobile terminal that comprises a single chip WLAN and Bluetooth radio on a single CMOS substrate, which may be utilized in connection with an embodiment of the invention.

FIG. 1 is a block diagram illustrating and exemplary mobile terminal that comprises a single chip WLAN and Bluetooth radio on a single CMOS substrate, which may be utilized in connection with an embodiment of the invention. Referring to FIG. 1, there is shown mobile terminal 120 that may comprise a WLAN and BT (WLAN/BT) receiver 123a, a WLAN and BT (WLAN/BT) transmitter 123b, a WLAN digital baseband processor 129a, a BT digital baseband processor 129b, a processor 125, and a memory 127. In some embodiments of the invention, the WLAN/BT receiver 123a, and WLAN/BT transmitter 123b may be integrated into a WLAN/BT transceiver 122, for example. A single transmit and receive antenna 121 may be communicatively coupled to the WLAN/BT receiver 123a and the WLAN/BT transmitter 123b. A switch 124, or other device having switching capabilities may be coupled between the WLAN/BT receiver 123a and WLAN/BT transmitter 123b, and may be utilized to switch the antenna 121 between transmit and receive functions.

The WLAN/BT receiver 123a may comprise suitable logic, circuitry, and/or code that may enable processing of received WLAN RF signals and/or BT RF signals. The WLAN/BT receiver 123a may enable receiving RF signals in frequency bands utilized by WLAN and/or BT communication systems.

The WLAN digital baseband processor 129a may comprise suitable logic, circuitry, and/or code that may enable processing and/or handling of WLAN baseband signals. In this regard, the WLAN digital baseband processor 129a may process or handle WLAN signals received from the WLAN/BT receiver 123a and/or WLAN signals to be transferred to the WLAN/BT transmitter 123b for transmission via a wireless communication medium. The WLAN digital baseband processor 129a may also provide control and/or feedback information to the WLAN/BT receiver 123a and to the WLAN/BT transmitter 123b, based on information from the processed WLAN signals. The WLAN digital baseband processor 129a may communicate information and/or data from the processed WLAN signals to the processor 125 and/or to the memory 127. Moreover, the WLAN digital baseband processor 129a may receive information from the processor 125 and/or to the memory 127, which may be processed and transferred to the WLAN/BT transmitter 123b for transmission of WLAN signals via the wireless communication medium.

The BT digital baseband processor 129b may comprise suitable logic, circuitry, and/or code that may enable processing and/or handling of BT baseband signals. In this regard, the BT digital baseband processor 129b may process or handle BT signals received from the WLAN/BT receiver 123a and/or BT signals to be transferred to the WLAN/BT transmitter 123b for transmission via a wireless communication medium. The BT digital baseband processor 129b may also provide control and/or feedback information to the WLAN/BT receiver 123a and to the WLAN/BT transmitter 123b, based on information from the processed BT signals. The BT digital baseband processor 129b may communicate information and/or data from the processed BT signals to the processor 125 and/or to the memory 127. Moreover, the BT digital baseband processor 129b may receive information from the processor 125 and/or to the memory 127, which may be processed and transferred to the WLAN/BT transmitter 123b for transmission of BT signals via the wireless communication medium.

The WLAN/BT transmitter 123b may comprise suitable logic, circuitry, and/or code that may enable processing of WLAN and/or BT signals for transmission. The WLAN/BT transmitter 123b may enable transmission of RF signals in frequency bands utilized by WLAN and/or BT systems.

The processor 125 may comprise suitable logic, circuitry, and/or code that may enable control and/or data processing operations for the mobile terminal 120. The processor 125 may be utilized to control at least a portion of the WLAN/BT receiver 123a, the WLAN/BT transmitter 123b, the WLAN digital baseband processor 129a, BT digital baseband processor 129b, and/or the memory 127. In this regard, the processor 125 may generate at least one signal for controlling operations within the mobile terminal 120.

The memory 127 may comprise suitable logic, circuitry, and/or code that may enable storage of data and/or other information utilized by the mobile terminal 120. For example, the memory 127 may be utilized for storing processed data generated by the WLAN digital baseband processor 129a, BT digital baseband processor 129b and/or the processor 125. The memory 127 may also be utilized to store information, such as configuration information, that may be utilized to control the operation of at least one block in the mobile terminal 120. For example, the memory 127 may comprise information necessary to configure the WLAN/BT receiver 123a to enable receiving WLAN and/or BT signals in the appropriate frequency band.

Figure 2A:
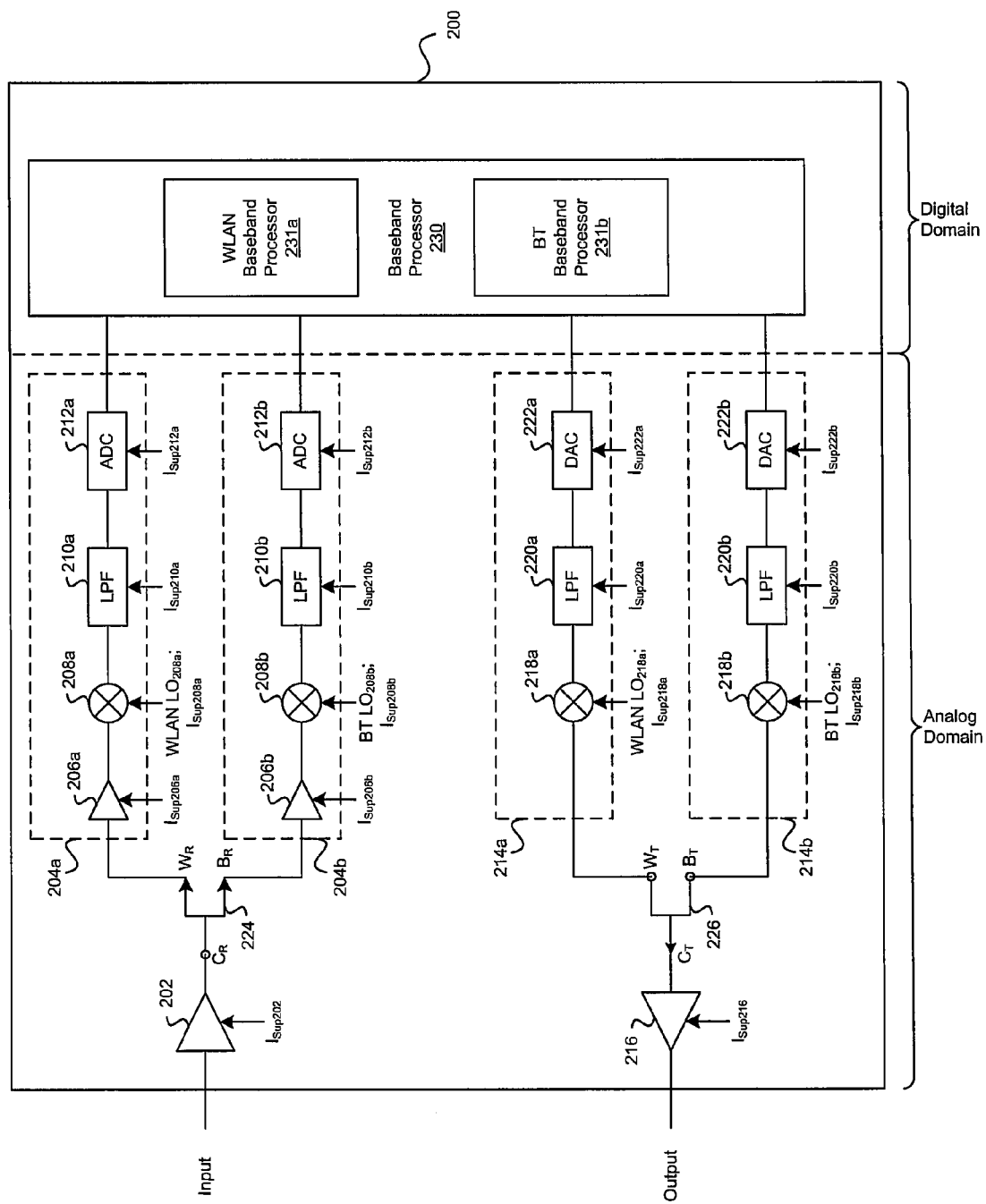
FIG. 2A is an exemplary block diagram illustrating a single chip comprising WLAN and Bluetooth radios on a single CMOS substrate, which may be utilized in connection with an embodiment of the invention.

FIG. 2A is an exemplary block diagram illustrating a single chip comprising WLAN and Bluetooth radios on a single CMOS substrate, which may be utilized in connection with an embodiment of the invention. Referring to FIG. 2A, there is shown a single chip WLAN and BT radio 200. The single chip WLAN and BT radio 200 may comprise a shared LNA 202, a WLAN receiver 204a, a BT receiver 204b, a shared power amplifier (PA) 216, a WLAN transmitter 214a, a BT transmitter 214b, power splitter 224, power combiner 226, and a baseband processor 230. The WLAN receiver 204a may comprise a WLAN LNA 206a, a WLAN mixer 208a, a low pass filter (LPF) 210a, and an ADC 212a. The BT receiver 204b may comprise a WLAN LNA 206b, a WLAN mixer 208b, a low pass filter (LPF) 210b, and an ADC 212b. The WLAN transmitter 214a may comprise a WLAN mixer 218a, a low pass filter (LPF) 220a, and a DAC 222a. The BT transmitter 214b may comprise a WLAN mixer 218b, a low pass filter (LPF) 220*b*, and a DAC 222*b*. The baseband processor 230 may comprise a WLAN baseband processor 231*a* and a BT baseband processor 231*b*.

The LNA 202 may comprise suitable logic, circuitry, and/or code that may enable amplification of weak signals (as measured by dBm, for example), such as received from an antenna. The LNA 202 receives a signal labeled as Input in FIG. 2A, and generates an output signal labeled as $C_R$ in FIG. 2A. The Input signal may be an RF signal received at an antenna, which may be communicatively coupled to the LNA 202. The LNA 202 may receive an input supply current labeled as $I_{Sup202}$ in FIG. 2A. The supply current level may be selected to enable linear operation of the LNA 202. In the linear range of operation, the amplitude of the output signal from the LNA 202 may be represented as a linear function of the amplitude of the input signal over a range of input signal amplitudes. The linear function may be based on the gain of the LNA 202 over at least a portion of the range of input signal amplitudes.

The WLAN receiver 204*a* may comprise suitable logic, circuitry, and/or code that may enable amplification, downconversion, filtering, and/or ADC processing of a received WLAN signal. The BT receiver 204*b* may comprise suitable logic, circuitry, and/or code that may enable amplification, downconversion, filtering, and/or ADC processing of a received BT signal.

The WLAN LNA 206*a* may be substantially similar to the LNA 202. The WLAN LNA 206*a* may receive an input supply current labeled as $I_{Sup206a}$ in FIG. 2A. The supply current level may be selected to enable linear operation of the WLAN LNA 206*a*.

The BT LNA 206*b* may be substantially similar to the LNA 202. The BT LNA 206*b* may receive an input supply current labeled as $I_{Sup206b}$ in FIG. 2A. The supply current level may be selected to enable linear operation of the BT LNA 206*b*.

The WLAN mixer 208*a* may comprise suitable logic, circuitry, and/or code that may enable downconversion of an input signal. The WLAN mixer 208*a* may utilize an input local oscillator signal labeled as WLAN $LO_{208a}$ (in FIG. 2A) to downconversion the input signal. The input signal may be an RF signal that is downconversion to generate a baseband signal, or an intermediate frequency (IF) signal. In general, the WLAN mixer 208*a* may produce signals for which the frequencies may be the sum and difference of the frequency of the input signal, the frequency of the signal WLAN $LO_{208a}$, and/or harmonic frequencies derived from the before mentioned signals. The WLAN mixer 208*a* may receive an input supply current labeled as $I_{Sup208a}$ in FIG. 2A. The supply current level may be selected to enable the downconversion operation of the WLAN mixer 208*a*.

The BT mixer 208*b* may be substantially similar to the WLAN mixer 208*a*. The BT mixer 208*b* may utilize an input local oscillator signal labeled as BT $LO_{208b}$ (in FIG. 2A) to downconvert the input signal. The WLAN mixer 208*b* may receive an input supply current labeled as $I_{Sup208b}$ in FIG. 2A. The supply current level may be selected to enable the downconversion operation of the WLAN mixer 208*b*.

The LPF 210*a* may comprise suitable logic, circuitry, and/or code that may enable selection of a cutoff frequency. The LPF 210*a* may enable attenuation of the amplitudes of input signal components for which the corresponding frequency is higher than the cutoff frequency, while the amplitudes of input signal components for which the corresponding frequency is less than the cutoff frequency may "pass," or not be attenuated, or attenuated to a lesser degree than input signal components at frequencies higher than the cutoff frequency. In various embodiments of the invention, the LPF 210*a* may be implemented as a passive filter, such as one that utilizes resistor, capacitor, and/or inductor elements, or implemented as an active filter, such as one that utilizes an operational amplifier. The LPF 210*a* may receive an input supply current labeled as $I_{Sup210a}$ in FIG. 2A. The supply current level may be selected to enable the filtering operation of the LPF 210*a*.

The LPF 210*b* may be substantially similar to the LPF 210*a*. The LPF 210*b* may receive an input supply current labeled as $I_{Sup210b}$ in FIG. 2A. The supply current level may be selected to enable the filtering operation of the LPF 210*b*.

The ADC 212*a* may comprise suitable logic, circuitry, and/or code that may enable conversion of an input analog signal to a corresponding digital representation. The ADC 212*a* may receive an input analog signal, characterized by a signal amplitude.

The ADC 212*a* may quantize the analog signal by correlating ranges of analog signal level values to corresponding numerical values. The ADC 212*a* may determine analog signal levels at distinct time instants by measuring, or integrating, the analog signal level of the input signal during a time interval referred to as δt. The time interval between measurements, or sampling interval, may be determined based on a sampling rate, which typically, may be long in comparison to the integration time interval δt. The ADC 212*a* may receive an input supply current labeled as $I_{Sup212a}$ in FIG. 2A. The supply current level may be selected to enable the conversion operation of the ADC 212*a*.

The ADC 212*b* may be substantially similar to the ADC 212*a*. The ADC 212*b* may receive an input supply current labeled as $I_{Sup212b}$ in FIG. 2A. The supply current level may be selected to enable the conversion operation of the ADC 212*b*.

The power splitter 224 may comprise suitable logic, circuitry, and/or code that may enable an input signal to be coupled to a plurality of output points. In an exemplary embodiment of the invention, the power splitter 224 may receive a single input signal labeled $C_R$ in FIG. 2A, which may be coupled to two output points, which are labeled $B_R$ and $W_R$, respectively, in FIG. 2A.

The WLAN transmitter 214*a* may comprise suitable logic, circuitry, and/or code that may enable generation of a transmitted WLAN signal by DAC processing, filtering, and/or upconversion of an input baseband signal. The BT transmitter 214*b* may comprise suitable logic, circuitry, and/or code that may enable generation of a transmitted BT signal by DAC processing, filtering, and/or upconversion of an input baseband signal.

The DAC 222*a* may comprise suitable logic, circuitry, and/or code that may enable conversion of an input digital signal to a corresponding analog representation. The DAC 222*a* may receive an input supply current labeled as $I_{Sup222a}$ in FIG. 2A. The supply current level may be selected to enable the conversion operation of the DAC 222*a*.

The DAC 222*b* may be substantially similar to the DAC 222*a*. The DAC 222*b* may receive an input supply current labeled as $I_{Sup222b}$ in FIG. 2A. The supply current level may be selected to enable the conversion operation of the DAC 222*b*.

The LPF 220*a* may be substantially similar to the LPF 210*a*. The LPF 220*a* may receive an input supply current labeled as $I_{Sup220a}$ in FIG. 2A. The supply current level may be selected to enable the filtering operation of the LPF 220*a*.

The LPF 220*b* may be substantially similar to the LPF 210*a*. The LPF 220*b* may receive an input supply current labeled as $I_{Sup220b}$ in FIG. 2A. The supply current level may be selected to enable the filtering operation of the LPF 220*b*.

The WLAN mixer 218a may comprise suitable logic, circuitry, and/or code that may enable generation of a WLAN signal by upconversion of an input signal. The WLAN mixer 218a may utilize an input local oscillator signal labeled as WLAN $LO_{218a}$ to upconvert the input signal. The upconverted signal may be an RF signal. The WLAN mixer 218a may produce a WLAN RF signal for which the carrier frequency may be approximately equal to the frequency of the signal WLAN $LO_{218a}$. The WLAN mixer 218a may receive an input supply current labeled as $I_{Sup218a}$ in FIG. 2A. The supply current level may be selected to enable the upconversion operation of the WLAN mixer 218a.

The BT mixer 218b may be substantially similar to the WLAN mixer 218a. The BT mixer 218b may utilize an input local oscillator signal labeled as BT $LO_{218b}$ (in FIG. 2A) to upconvert the input signal. The WLAN mixer 218b may receive an input supply current labeled as $I_{Sup218b}$ in FIG. 2A. The supply current level may be selected to enable the downconversion operation of the WLAN mixer 218b.

The PA 216 may comprise suitable logic, circuitry, and/or code that may enable amplification of input signals to generate a transmitted signal of sufficient signal power (as measured by dBm, for example) for transmission via a wireless communication medium. The PA 202 receives an input signal labeled $C_T$ in FIG. 2A, and generates a signal labeled as Output in FIG. 2A. The Output signal may be an RF signal transmitted via an antenna, which is communicatively coupled to the PA 216. The PA 216 may receive an input supply current labeled as $I_{Sup216}$ in FIG. 2A. The supply current level may be selected to enable linear operation of the PA 216 over a range of input signal amplitudes. The linear operation may be based on the gain of the PA 216 over at least a portion of the range of input signal amplitudes.

The power combiner 226 may comprise suitable logic, circuitry, and/or code that may enable a plurality of input points to be coupled to an output point. In an exemplary embodiment of the invention, the power combiner 226 may enable a plurality of input signals, which are labeled $B_T$ and $W_T$, respectively, in FIG. 2A, to be coupled to a single output point, which is labeled $C_T$ in FIG. 2A.

The baseband processor 230 may comprise suitable logic, circuitry, and/or code that may enable processing of binary data contained within an input baseband signal. The baseband processor 230 may perform processing tasks, which correspond to one or more layers in an applicable protocol reference model (PRM). For example, the baseband processor 230 may perform physical (PHY) layer processing, layer 1 (L1) processing, medium access control (MAC) layer processing, logical link control (LLC) layer processing, layer 2 (L2) processing, and/or higher layer protocol processing based on input binary data. The processing tasks performed by the baseband processor 230 may be referred to as being within the digital domain. The baseband processor 230 may also generate control signals based on the processing of the input binary data. The WLAN baseband processor 231a may perform processing tasks related to the transmission and/or reception of WLAN signals, while the BT baseband processor 231b may perform processing tasks related to the transmission and/or reception of BT signals.

In operation, the LNA 202, WLAN receiver 204a, WLAN transmitter 214a, BT receiver 204b, BT transmitter 214b, and PA 216 may process analog signals, and may therefore be referred to as performing processing tasks in the analog domain.

The LNA 202 may receive an input RF signal Input, and generate an amplified signal that may be coupled, by the power splitter 224, to the point labeled $W_R$ in FIG. 2A. The LNA 202 may provide a first stage of amplification gain that may be suitable for either reception of WLAN signals and/or BT signals. The WLAN LNA 206a may amplify an input signal at the point labeled $W_R$ to provide a second stage of amplification gain that may be suitable for reception of WLAN signals. Similarly, the BT LNA 206b may amplify an input signal at the point labeled $B_R$ to provide a second stage of amplification gain that may be suitable for reception of BT signals.

The WLAN mixer 208a may utilize the input local oscillator signal WLAN $LO_{208a}$ to downconvert an input signal received from the WLAN LNA 206a. Similarly, the BT mixer 208b may utilize the input local oscillator signal BT $LO_{208b}$ to downconvert an input signal received from the BT LNA 206b. The LPF 210a may be configured to pass a frequency component of an input signal, received from the WLAN mixer 208a, for which the frequency is approximately equal to the difference between the frequency of the signal labeled Input, and the frequency of the signal labeled WLAN $LO_{208a}$. The signal amplitudes of other frequency components in the input signal to the LPF 210a may be attenuated. The LPF 210b may similarly pass a frequency component of an input signal received from the BT mixer 208b, for which the frequency is approximately equal to the difference between the frequency of the signal labeled Input, and the frequency of the signal labeled BT $LO_{208b}$.

The ADC 212a may sample signal amplitudes in the analog input signal received from the LPF 210a, and generate a baseband signal that comprises bits generated based on conversion of the sampled signal amplitudes in the analog input signal. The ADC 212b may similarly generate a baseband signal from an analog input signal received from the LPF 210b. The WLAN baseband processor 231a may perform processing on the bits contained in the input baseband signal received from the ADC 212a, while the BT baseband processor 231b may perform processing on the bits contained in the input baseband signal received from the ADC 212b.

The WLAN baseband processor 231a may generate a baseband signal comprising bits that may be communicated to the DAC 222a, while the BT baseband processor 231b may generate a baseband signal comprising bits that may be communicated to the DAC 222b. The DAC 222a may generate an analog signal, which comprises one or more signal levels based on input bits received from the baseband processor 230. The DAC 222b may similarly generate an analog signal based on input bits received from the baseband processor 230. The analog signal generated by the DAC 222a may comprise a plurality of undesirable high frequency components. The signal amplitudes of these undesirable frequency components may be attenuated by the LPF 220a. Similarly, signal amplitudes associated with undesirable frequency components in the analog signal generated by the DAC 222b may be attenuated by the LPF 220b.

The WLAN mixer 218a may generate an RF WLAN signal by upconverting the input signal received from the LPF 220a with a carrier signal based on the input local oscillator signal WLAN $LO_{218a}$. Similarly, the BT mixer 218b may generate an RF BT signal by upconverting the input signal received from the LPF 220b with a carrier signal based on the input local oscillator signal WLAN $LO_{218b}$.

The power combiner 226 may couple a signal from the WLAN mixer 218a at the point labeled $W_T$ in FIG. 2A, to the input to the PA 216 at the point labeled $C_T$ in FIG. 2A. The PA 216 may provide suitable amplification of the power level of the input signal for transmission of the signal labeled Output via a wireless communication medium. The power combiner 226 may also couple a signal from the BT mixer 218b at the point labeled $B_T$ in FIG. 2A, to the input of the PA 216 at the point labeled $C_T$ in FIG. 2A.

The baseband processor 230 may generate control signals that control subsequent operation of the WLAN receiver 204a, and/or the BT receiver 204b. For example, the WLAN baseband processor 231a may generate control signals that select a frequency for the input local oscillator signal WLAN $LO_{208a}$, while the BT baseband processor 231b may generate control signals that select a frequency for the input local oscillator signal BT $LO_{208b}$. The baseband processor 230 may also generate control signals that control subsequent operation of the WLAN transmitter 214a, and/or the BT transmitter 214b. For example, the WLAN baseband processor 231a may generate control signals that select a frequency for the input local oscillator signal WLAN $LO_{218a}$, while the BT baseband processor 231b may generate control signals that select a frequency for the input local oscillator signal BT $LO_{218b}$.

Figure 2B:
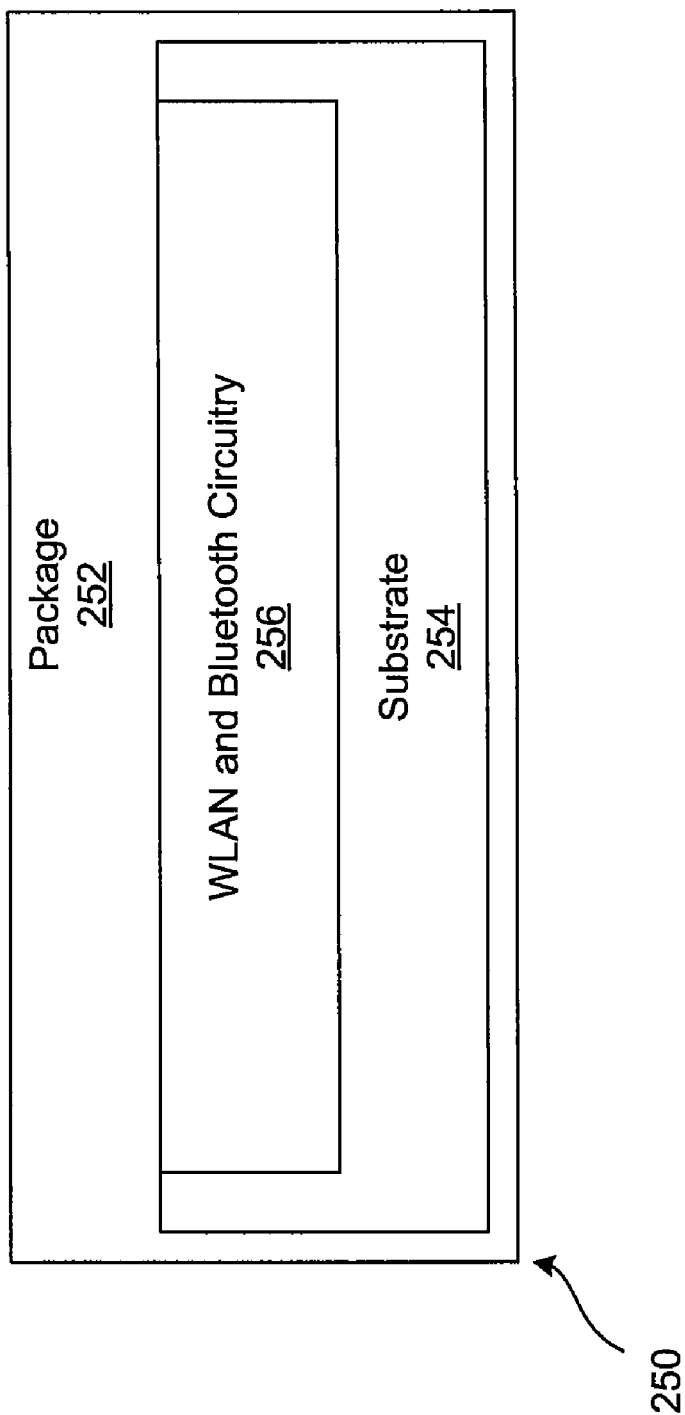
FIG. 2B is an illustration of exemplary WLAN and Bluetooth circuitry on a single substrate, in accordance with an embodiment of the invention.

FIG. 2B is an illustration of exemplary WLAN and Bluetooth circuitry on a single substrate, in accordance with an embodiment of the invention. Referring to FIG. 2B, there is shown a single chip WLAN and BT radio 250. The single chip WLAN and BT radio 250 may comprise a package 252. The package 252 may comprise a substrate 254. The substrate 254 may comprise WLAN and BT circuitry 256 integrated into the substrate 254 by a semiconductor fabrication process such as CMOS.

Figure 3:
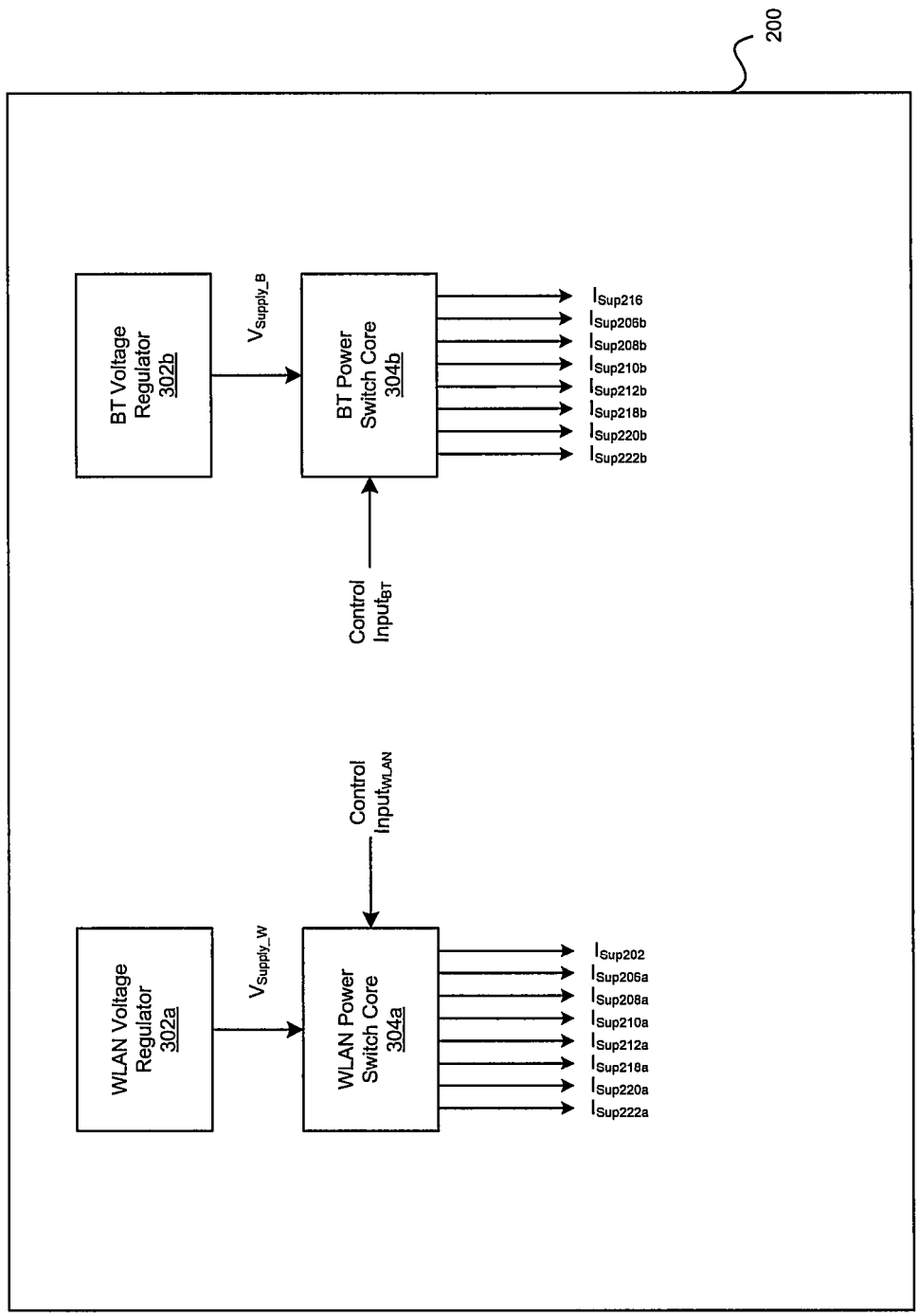
FIG. 3 is a block diagram illustrating exemplary power switch circuitry that may be utilized for supplying currents to WLAN and Bluetooth circuitry on a single chip device, in accordance with an embodiment of the invention.

FIG. 3 is a block diagram illustrating exemplary power switch circuitry that may be utilized for supplying currents to WLAN and Bluetooth circuitry on a single chip device, in accordance with an embodiment of the invention. Referring to FIG. 3, there is shown the single chip WLAN and BT radio 200. The single chip WLAN and BT radio may comprise a WLAN voltage regulator 302a, a WLAN power switch core 304a, a BT voltage regulator 302b, and a BT power switch core 304b.

The WLAN voltage regulator 302a may comprise suitable logic, circuitry, and/or code that may enable generation of a supply voltage, labeled $V_{Supply\_W}$ in FIG. 3, for which the amplitude may be substantially independent of operating temperature variations, manufacturing process variations, and/or variations and/or component mismatches within the circuitry.

The WLAN power switch core 304a may comprise suitable logic, circuitry, and/or code that may enable generation of input supply currents for the WLAN receiver 204a and/or WLAN transmitter 214a based on a received input voltage level labeled $V_{Supply\_W}$ in FIG. 3, and an input control signal labeled Control Input$_{WLAN}$. The input supply currents may comprise $I_{Sup206a}$, $I_{Sup208a}$, $I_{Sup210a}$, $I_{Sup212a}$, $I_{Sup218a}$, $I_{Sup220a}$, and $I_{Sup222a}$ (FIG. 2A). When the WLAN power switch core 304a receives an ON Control Input$_{WLAN}$ signal, the current levels for the input supply currents may be based on the amplitude of the input voltage level $V_{Supply\_W}$. In this regard, the ON Control Input$_{WLAN}$ signal may enable coupling of the input voltage level $V_{Supply\_W}$ and circuitry within the WLAN receiver 204a and/or within the WLAN transmitter 214a. When the WLAN power switch core 304a receives an OFF Control Input$_{WLAN}$ signal, the current levels for the input supply currents may be substantially equal to zero (0). In this regard, the ON Control Input$_{WLAN}$ signal may enable isolation of the input voltage level $V_{supply\_W}$ from circuitry within the WLAN receiver 204a and/or within the WLAN transmitter 214a.

The BT voltage regulator 302b may be substantially similar to the WLAN voltage regulator 302a. The BT voltage regulator 302b may enable generation of a supply voltage labeled $V_{Supply\_B}$ in FIG. 3.

The BT power switch core 304b may be substantially similar to the WLAN power switch core 304a. The BT power switch core 304b may enable generation of input supply currents for the BT receiver 204b and/or BT transmitter 214b based on a received input voltage level labeled $V_{Supply\_B}$ in FIG. 3, and an input control signal labeled Control Input$_{BT}$. The input supply currents may comprise $I_{Sup206b}$, $I_{Sup208b}$, $I_{Sup210b}$, $I_{Sup212b}$, $I_{Sup218b}$, $I_{Sup220b}$, and $I_{Sup222b}$ (FIG. 2A). When the BT power switch core 304b receives an ON Control Input$_{BT}$ signal, the current levels for the input supply currents may be based on the amplitude of the input voltage level $V_{Supply\_B}$. In this regard, the ON Control Input$_{BT}$ signal may enable coupling of the input voltage level $V_{Supply\_B}$ and circuitry within the BT receiver 204b and/or within the BT transmitter 214b. When the BT power switch core 304b receives an OFF Control Input$_{BT}$ signal, the current levels for the input supply currents may be substantially equal to zero (0). In this regard, the ON Control Input$_{BT}$ signal may enable isolation of the input voltage level $V_{Supply\_B}$ from circuitry within the BT receiver 204b and/or within the BT transmitter 214b.

Figure 4:
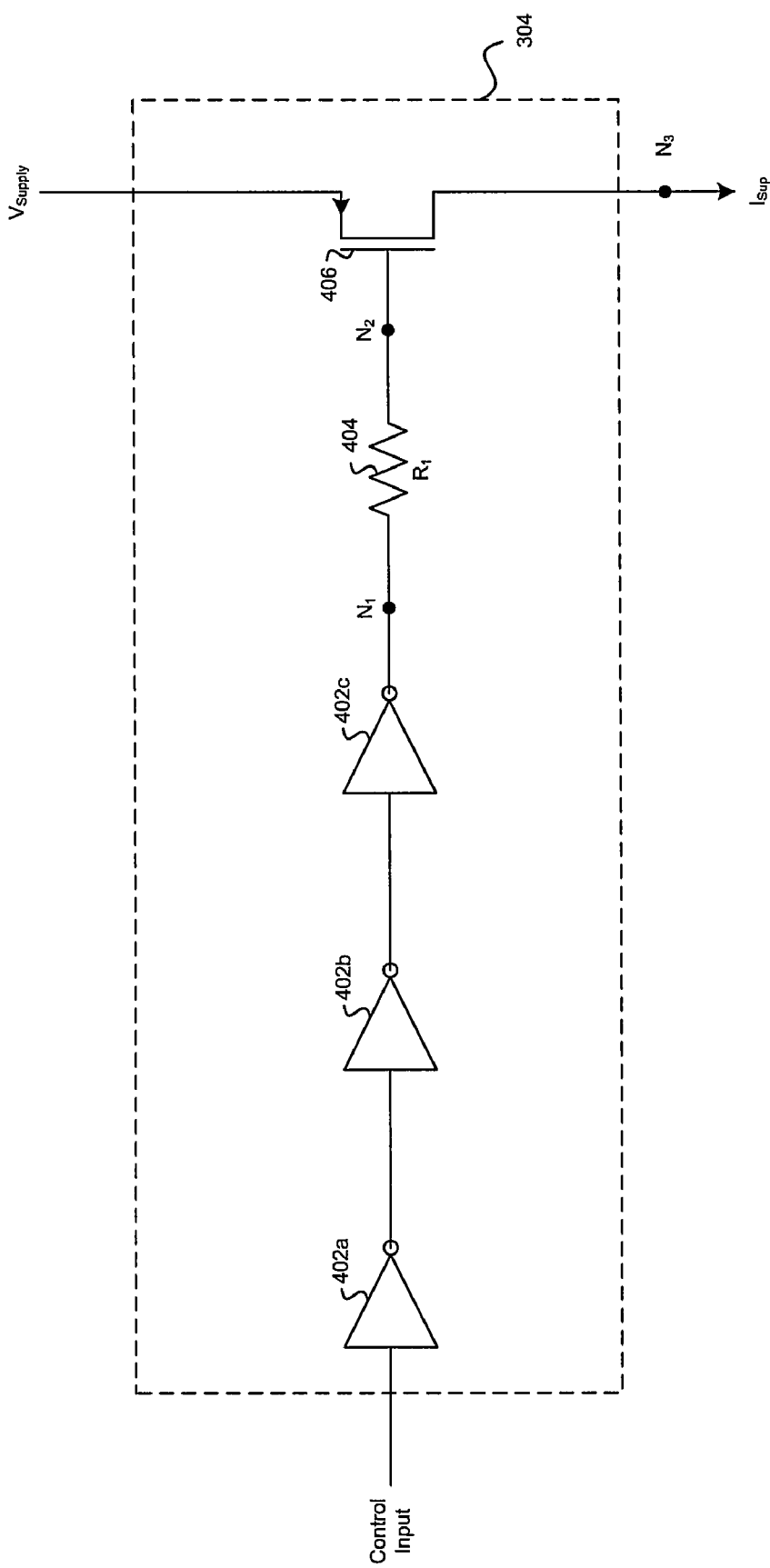
FIG. 4 is a block diagram illustrating exemplary power switch circuitry, in accordance with an embodiment of the invention.

FIG. 4 is a block diagram illustrating exemplary power switch circuitry, in accordance with an embodiment of the invention. Referring to FIG. 4, there is shown power switch core circuit 304. The power switch core circuit 304 may represent the WLAN power switch core circuit 304a (FIG. 3), and/or the BT power switch core circuit 304b. The power switch core circuit 304 may comprise a plurality of buffers 402a, 402b, and 402c, a resistor 404, and a transistor 406.

The buffer 402a may comprise suitable logic, circuitry, and/or code that may enable connection of a high impedance source to a low impedance load without significant attenuation, and/or distortion of the signal generated by the source. The buffer 402a may receive an input signal labeled Control Input in FIG. 4. The Control Input signal may represent either the Control Input$_{WLAN}$ signal and/or the Control Input$_{BT}$ signal from FIG. 3. The buffers 402b, and 402c may be substantially similar to the buffer 402a.

The transistor 406 may be coupled to a voltage labeled $V_{Supply}$ in FIG. 4. The voltage $V_{Supply}$ may represent either voltage $V_{Supply\_W}$ and/or $V_{Supply\_B}$ from FIG. 3. The drain to source current through the transistor 406 is labeled $I_{Sup}$ in FIG. 4. The current $I_{Sup}$ may represent any of the input supply currents $I_{Sup206a}$, $I_{Sup208a}$, $I_{Sup210a}$, $I_{Sup212a}$, $I_{Sup218a}$, $I_{Sup220a}$, $I_{Sup222a}$, $I_{Sup206b}$, $I_{Sup208b}$, $I_{Sup210b}$, $I_{Sup212b}$, $I_{Sup218b}$, $I_{Sup220b}$, and/or $I_{Sup222b}$ from FIGS. 2 and/or 3. In an exemplary embodiment of the invention, the current $I_{Sup}$ may comprise a determined value such that one or more currents $I_{Sup}$ may be generated by a corresponding number of power switch core circuits 304, wherein the individual currents $I_{Sup}$ supplied by each instance of the power switch core circuit 304 may be summed to supply a current level required for any of the before mentioned input supply currents.

The transistor 406 may be shown in FIG. 4 as a p-type depletion mode MOS transistor, however, in various embodiments of the invention, n-type transistors, enhancement mode transistors, and non-MOS transistors may also be utilized. For example, the invention may also be practiced when the transistor 406 is a JFET or bipolar transistor.

In operation, each of the buffers 402a, 402b, and 402c may generate an output signal that is a logically inverted version of the input signal. The buffer 402a may, for example, receive a Control Input signal that corresponds to a logical HI value, and generate an output signal that corresponds to a logical LO value. In an exemplary embodiment of the invention, the Control Input signal may be generated by the baseband processor 230 (FIG. 2A). The output signal from the buffer 402a may become an input signal to the buffer 402b. The output signal from the buffer 402b may, therefore, represent the polarity of the Control Input signal. The output signal from the buffer 402b may become an input signal to the buffer 402c. The output signal from the buffer 402c may, therefore, represent an inverted version of the Control Input signal.

The buffer 402c may generate a voltage level corresponding to the Control Input signal in addition to supplying an output current, which may be sufficient to maintain the generated voltage level at the node labeled $N_1$ in FIG. 4. For example, when the Control Input signal corresponds to a logical LO value, the node labeled $N_1$ may correspond to a logical HI value. The logical HI value at the node $N_1$ may cause the transistor 406 to enter an OFF state, for which the current level for $I_{REF}$ may be substantially equal to zero (0). When the transistor 406 is in the OFF state, the voltage level $V_{Supply}$ may be isolated from circuitry within the WLAN receiver 204a, WLAN transmitter 214a, BT receiver 204b, and/or BT transmitter 214b.

However, when the Control Input signal corresponds to a logical HI value, the node labeled $N_1$ may correspond to a logical LO value. The logical LO value at the node $N_1$ may cause the transistor 406 to enter a conducting state, for which the current level for $I_{Sup}$ may be substantially non-zero. In the conducting state, the transistor 406 may be modeled as a capacitor, which may be coupled between nodes $N_2$ and $N_3$ in FIG. 4. The resistor 404 and transistor 406 may function as a low pass filter, wherein the value for the resistor 404 may be selected to limit the rate at which the voltage level at the node $N_2$ may change in response to an abrupt change in the voltage level at the node $N_1$, for example when the voltage level at the node $N_1$ changes from a logic level HI to a logic level LO.

Limiting the rate of change in the voltage level at the node $N_2$ may result in a limitation in the rate of change in the voltage across the effective capacitor coupled between nodes $N_2$ and $N_3$. This, in turn, may result in a limitation in the transient in-rush current measured at the node $N_3$ during a start up sequence for circuitry within the WLAN receiver 204a, WLAN transmitter 214a, BT receiver 204b, and/or BT transmitter 214b.

At the end of the start up sequence, the quiescent state may be entered for which the voltage level $V_{Supply}$ may be coupled to circuitry within the WLAN receiver 204a, WLAN transmitter 214a, BT receiver 204b, and/or BT transmitter 214b. In addition, the current level $I_{Sup}$ may reach its quiescent state value.

By limiting the in-rush current during the start up sequence, various embodiments of the invention may enable the power switch core circuit 304 to limit the difference between the $I_{Sup}$ current level in the transient state, and the $I_{Sup}$ current level in the quiescent state.

Figure 5:
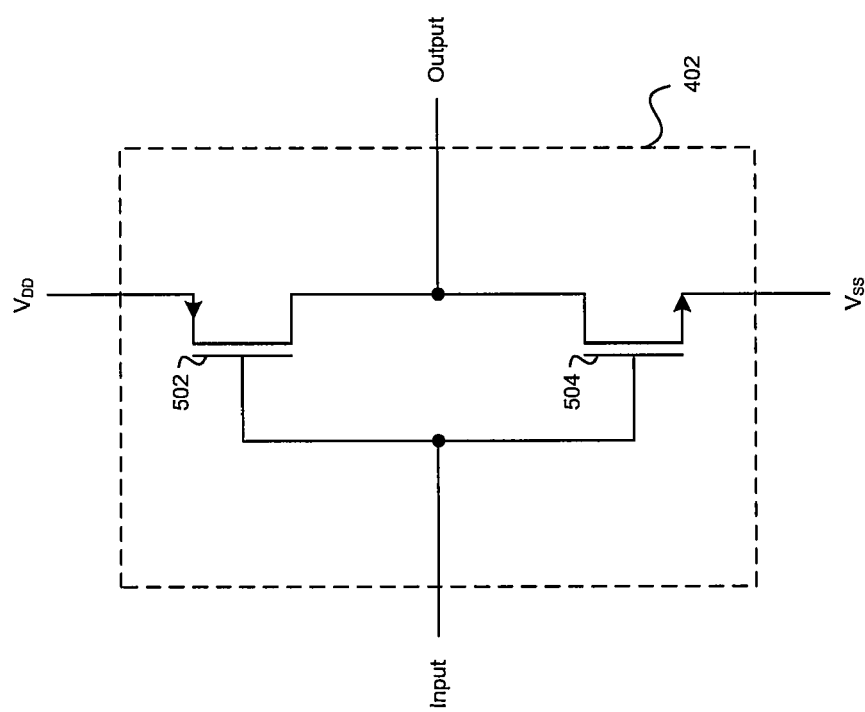
FIG. 5 is a block diagram illustrating exemplary buffer circuitry in a power switching circuit, in accordance with an embodiment of the invention.

FIG. 5 is a block diagram illustrating exemplary buffer circuitry in a power switching circuit, in accordance with an embodiment of the invention. Referring to FIG. 5, there is shown a buffer circuit 402. The buffer circuit 402 may represent any of the buffer circuits 402a, 402b, and/or 402c in FIG. 4. The buffer circuit may comprise transistors 502 and 504. The input signal to the buffer is labeled Input in FIG. 5, while the output signal from the buffer is labeled Output.

The gate terminal of the transistor 502 may be coupled to the point labeled Input, the source terminal of the transistor 502 may be coupled to a negative supply voltage labeled $V_{SS}$, and the drain terminal of the transistor 502 may be coupled to the point labeled Output. The gate terminal of the transistor 504 may be coupled to the point labeled Input, the source terminal of the transistor 504 may be coupled to a positive supply voltage labeled $V_{DD}$, and the drain terminal of the transistor 504 may be coupled to the point labeled Output.

The transistor 502 may be represented in FIG. 5 as a p-type enhancement mode MOS transistor, and the transistor 504 may be represented as an n-type enhancement mode MOS transistor, but the invention may not be so limited. Various embodiments of the invention may also be practiced for other transistor types such as described above, for example.

In an alternative embodiment of the invention, the transistor 504 may be modeled as a resistor. In this alternative embodiment of the invention, the value of the in-rush current during a start up sequence may also be limited by adjusting the geometry of the transistor 504 such that the effective resistance of the transistor 504, as measured between the points labeled $V_{DD}$ and Output, is increased. The effective resistance of the transistor 504 may be increased, for example, by decreasing the gate width, and/or increasing the gate length.

Figure 6:
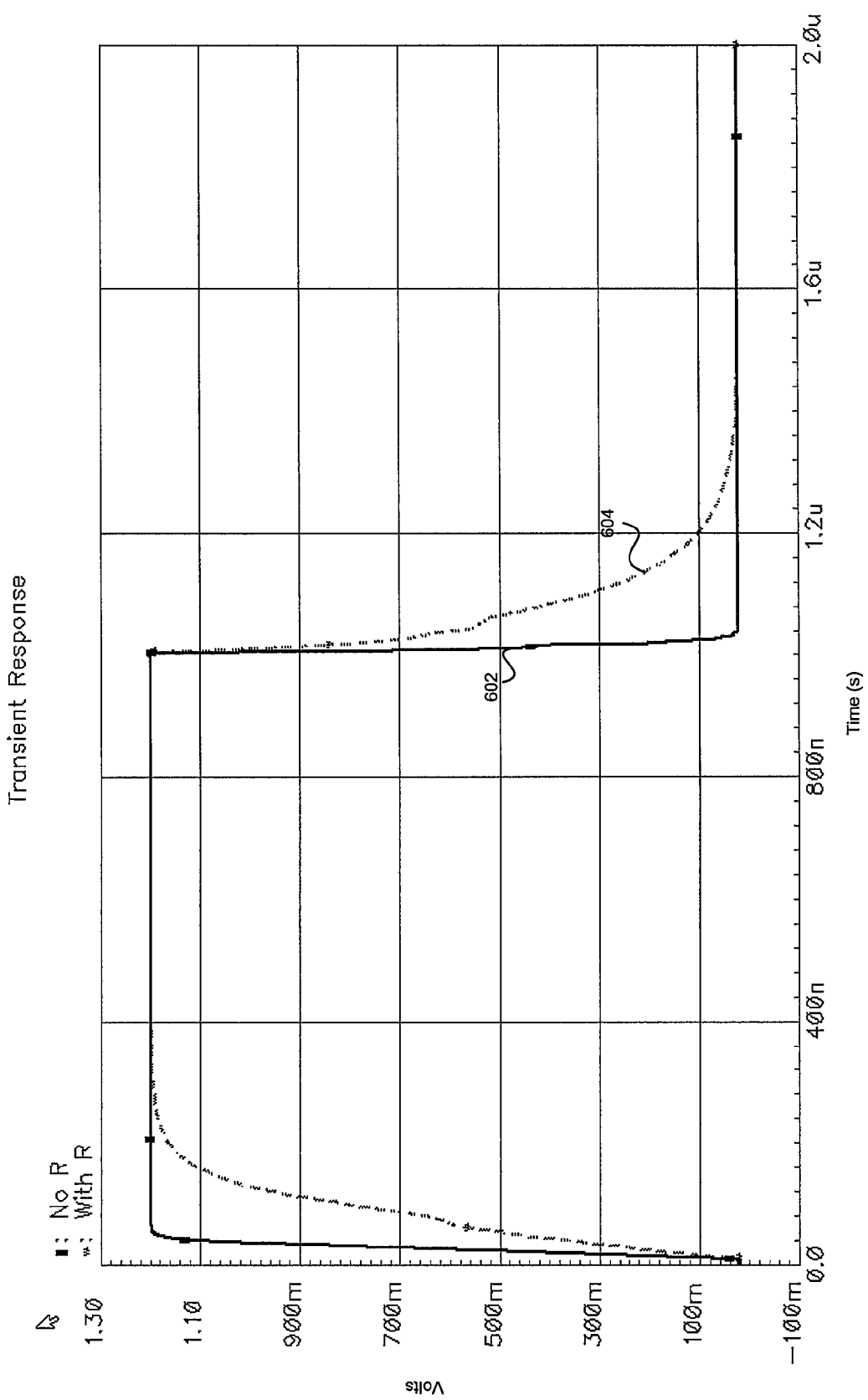
FIG. 6 is a graph illustrating exemplary voltage transient response curves for an exemplary power switching circuit, in accordance with an embodiment of the invention.

FIG. 6 is a graph illustrating exemplary voltage transient response curves for an exemplary power switching circuit, in accordance with an embodiment of the invention. FIG. 6 shows signal levels, as indicated in volts, at the node labeled $N_2$ in FIG. 4 over a time interval of about 2 microseconds. Referring to FIG. 6, graph 602 shows the transient voltage response curve for the case when the resistive value of the resistor 404 is zero (0) ohms. Graph 604 shows the transient voltage response curve for the case when the resistive value of the resistor 404 is approximately 20K ohms.

As may be seen in the exemplary graphs 602 and 604, the increase in the resistive value of the resistor 404 apparently limits the rate of change of the voltage at the node labeled $N_2$ in FIG. 4. For example, in graph 602, the indicated voltage changes from approximately 0 volts, to about 1.2 volts in approximately 60 ns, a rate of approximately $2 \cdot 10^7$ volts/second. By contrast, in graph 604, the indicated voltage changes from approximately 0 volts, to about 1.2 volts in approximately 280 ns, a rate of approximately $4.3 \cdot 10^6$ volts/second.

Figure 7:
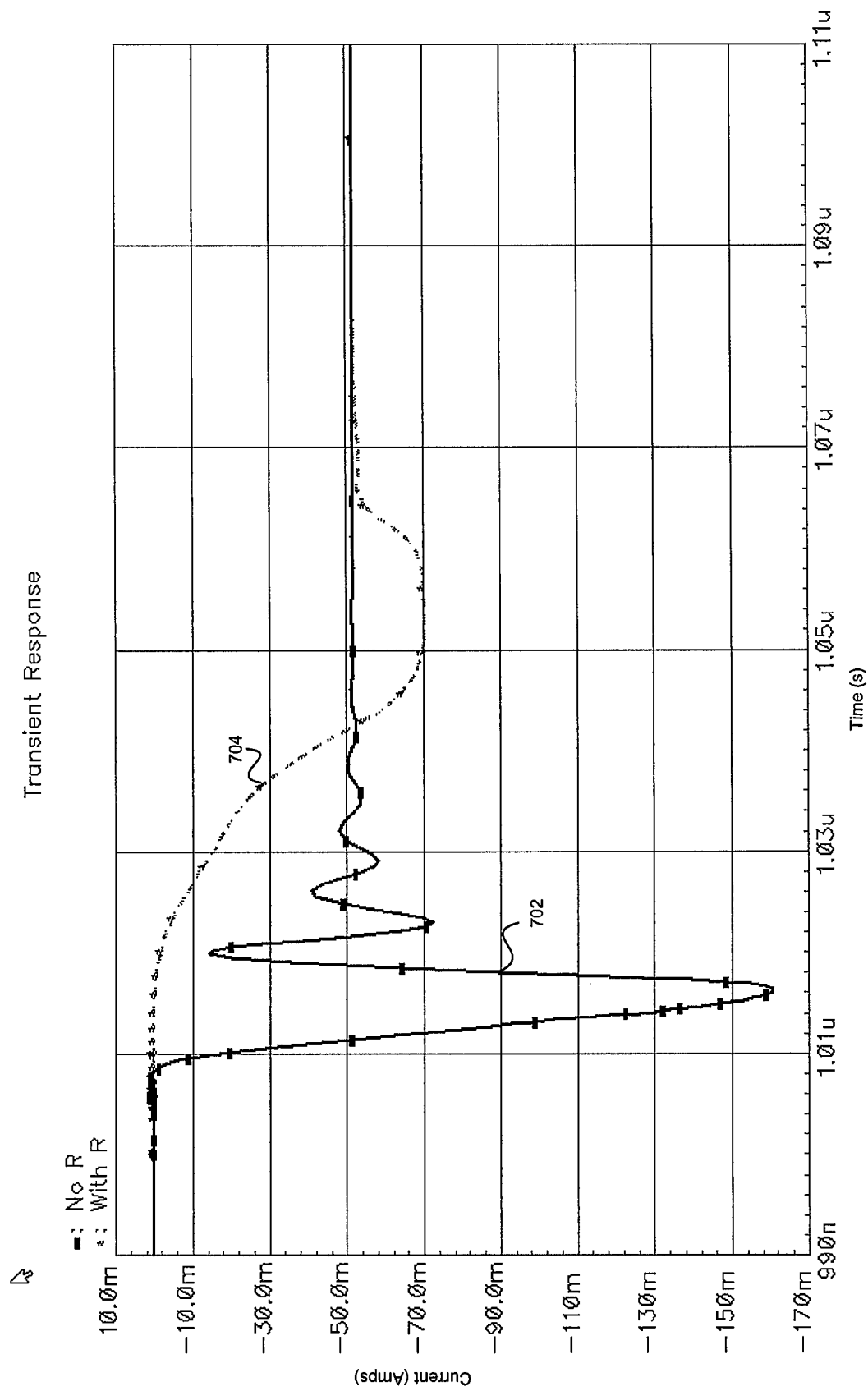
FIG. 7 is a graph illustrating exemplary current transient response curves for an exemplary power switching circuit, in accordance with an embodiment of the invention.

FIG. 7 is a graph illustrating exemplary current transient response curves for an exemplary power switching circuit, in accordance with an embodiment of the invention. FIG. 7 shows current levels, as indicated in amperes, at the mode labeled $N_3$ in FIG. 4 over a time interval of about 1.1 microseconds. Referring to FIG. 7, graph 702 shows the transient current response curve for the case when the resistive value of the resistor 404 is zero (0) ohms. Graph 704 shows the transient current response curve for the case when the resistive value of the resistor 404 is approximately 20K ohms.

As may be seen in the exemplary graphs 702 and 704, the increase in the resistive value of the resistor 404 apparently limits the peak transient value for the current $I_{Sup}$ in FIG. 4. For example, in graph 702, the peak transient value for the current $I_{Sup}$ is approximately −160 milliamps (mA), wherein the quiescent value for the current $I_{Sup}$ is approximately −50 mA, a range of approximately 110 mA. By contrast, in graph 704, the peak transient value for the current $I_{Sup}$ is approximately −70 mA, wherein the quiescent value for the current $I_{Sup}$ is approximately −50 mA, a range of approximately 20 mA.

In various embodiments of the invention, circuitry in a voltage regulator circuit 302a, and/or power switch core circuit 304 may be designed to provide a peak transient current level, or in-rush current level, which may be relatively close to the quiescent current level. Consequently, various embodiments of the invention may enable supplying currents sufficient for start up sequences in circuitry within the WLAN receiver 204a, WLAN transmitter 214a, BT receiver 204b, and/or BT transmitter 214b that may not require over designing of current supply circuitry, and/or utilizing power sequencing approaches.

Various embodiments of the invention may also be practiced in circuits wherein the WLAN voltage regulator circuit 302a and/or BT voltage regulator circuit 302b is replaced by a current source, or other customarily substitutable form of electronic power supply circuit. In various embodiments of the invention, the resistor 404 may be a variable resistor, wherein the resistive value may be determined based on a control signal from the baseband processor 230, for example.

Aspects of the system may include at least one resistive component 404, which is coupled between an input control signal and an output stage circuit 406 of a power switch circuit 304a, so as to limit a peak transient current level, which may result from in-rush current delivered by the power switch circuit 304a to a load impedance circuit 206a during a transient time interval during which a voltage level across the load impedance circuit 206a may rise or fall from an initial voltage level to a quiescent voltage level.

The power switch circuit 304a may be coupled at some point between a power supply source 302a and the load impedance circuit 206a. The quiescent voltage level may be derived from a source voltage level generated by the power supply source circuit 302a. The power supply switch circuit 304a may enable supplying of the quiescent voltage level to the load impedance circuit 206a by applying the input control signal to the power switch circuit 304a. The resistive component may be a resistor 404 and/or transistor 502. The resistive value for the transistor 502 may be determined by selecting a size for at least one physical dimension of the transistor 502. The resistive value for the resistor 404 may be variable.

The load impedance circuit 206a may be a component within a receiver circuit 204a, a transmitter circuit 214a, an LNA 202, a PA 216, and/or a processor circuit 230. The power switch circuit 304a may enable limitation of the peak transient current level by limiting a rate of change of the voltage level of the load impedance circuit 206a during the rise or fall from the initial voltage level to the quiescent voltage level. The power switch circuit 304a may enable limitation of the rate of change of the voltage level based on the selected resistance of the resistive component 404.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for electronic power supply control, the method comprising:
    selecting a resistance of at least one resistive component, which is coupled between an input control signal and an output stage circuit of a power switch circuit, wherein said power switch circuit comprises a plurality of buffers coupled between said input control signal and said output stage circuit, so as to limit a peak transient current level, said peak transient current level results from in-rush current delivered by said power switch circuit to a load impedance circuit during a transient time interval during which a voltage level across said load impedance circuit rises or falls from an initial voltage level to a quiescent voltage level; and
    limiting a rate of change of said voltage level across said load impedance circuit during said rise or fall from said initial voltage level to said quiescent voltage level, wherein said limiting of said rate of change of said voltage level across said load impedance limits said peak transient current level, wherein said change in voltage is caused by a change in voltage generated by at least one of said plurality of buffers.

2. The method according to claim 1, wherein said power switch circuit is coupled between a power supply source circuit and said load impedance circuit.

3. The method according to claim 2, wherein said quiescent voltage level is derived from a source voltage level generated by said power supply source circuit.

4. The method according to claim 3, comprising supplying said quiescent voltage level to said load impedance circuit by applying said input control signal to said power switch circuit.

5. The method according to claim 1, wherein said at least one resistive component is one or both of: at least one resistor, and at least one transistor.

6. The method according to claim 5, wherein said resistive value for said at least one transistor is determined by selecting a size for at least one physical dimension of said at least one transistor.

7. The method according to claim 5, wherein said resistive value for said at least one resistor is variable.

8. The method according to claim 1, wherein said load impedance circuit is one or more of: at least one component circuit within a receiver circuit, at least one component circuit within a transmitter circuit, at least one low noise amplifier circuit, at least one power amplifier circuit, and at least one processor circuit.

9. The method according to claim 1, comprising limiting said rate of change of said voltage level based on said selected resistance of at least one resistive component.

10. A system for electronic power supply control, the system comprising:

at least one resistive component, which is coupled between an input control signal and an output stage circuit of a power switch circuit, wherein said power switch circuit comprises a plurality of buffers coupled between said input control signal and said output stage circuit, so as to limit a peak transient current level, said peak transient current level results from in-rush current delivered by said power switch circuit to a load impedance circuit during a transient time interval during which a voltage level across said load impedance circuit rises or falls from an initial voltage level to a quiescent voltage level; and said power switch circuit is operable to limit a rate of change of said voltage level across said load impedance circuit during said rise or fall from said initial voltage level to said quiescent voltage level, wherein said limiting of said rate of change of said voltage level across said load impedance limits said peak transient current level, wherein said change in voltage is caused by a change in voltage generated by at least one of said plurality of buffers.

11. The system according to claim 10, wherein said power switch circuit is coupled between a power supply source circuit and said load impedance circuit.

12. The system according to claim 11, wherein said quiescent voltage level is derived from a source voltage level generated by said power supply source circuit.

13. The system according to claim 12, wherein said power switch circuit is operable to supply said quiescent voltage level to said load impedance circuit by applying said input control signal to said power switch circuit.

14. The system according to claim 10, wherein said at least one resistive component is one or both of: at least one resistor, and at least one transistor.

15. The system according to claim 14, wherein said resistive value for said at least one transistor is determined by selecting a size for at least one physical dimension of said at least one transistor.

16. The system according to claim 14, wherein said resistive value for said at least one resistor is variable.

17. The system according to claim 10, wherein said load impedance circuit is one or more of: at least one component circuit within a receiver circuit, at least one component circuit within a transmitter circuit, at least one low noise amplifier circuit, at least one power amplifier circuit, and at least one processor circuit.

18. The system according to claim 10, wherein said power switch circuit is operable to limit said rate of change of said voltage level based on said selected resistance of said at least one resistive component.

* * * * *